(12) United States Patent
Kuekes et al.

(10) Patent No.: US 7,948,271 B1
(45) Date of Patent: *May 24, 2011

(54) MOLECULAR WIRE CROSSBAR LOGIC (MWCL)

(75) Inventors: Philip J. Kuekes, Menlo Park, CA (US); James R. Heath, Santa Monica, CA (US)

(73) Assignees: Hewlett-Packard Company, Palo Alto, CA (US); The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/282,045

(22) Filed: Mar. 29, 1999

(51) Int. Cl.
*H03K 19/20* (2006.01)
*H03K 19/082* (2006.01)

(52) U.S. Cl. .......................... 326/104; 326/125

(58) Field of Classification Search .................. 326/1–7, 326/104; 977/932, 938, 940
See application file for complete search history.

(56) References Cited

U.S. PATENT DOCUMENTS
6,256,767 B1 * 7/2001 Kuekes et al. ................ 365/151
* cited by examiner

*Primary Examiner* — Rexford N Barnie
*Assistant Examiner* — Thienvu V Tran

(57) ABSTRACT

A programmable logic array (PLA) comprising a two-dimensional array of a plurality of nanometer-scale switches is provided. Each switch comprises a pair of crossed wires which form a junction where one wire crosses another and at least one connector species connecting the pair of crossed wires in the junction. The connector species comprises a bi-stable molecule. A plurality of switches is configurable as an AND gate and a plurality of switches is configurable as an OR gate.

30 Claims, 6 Drawing Sheets

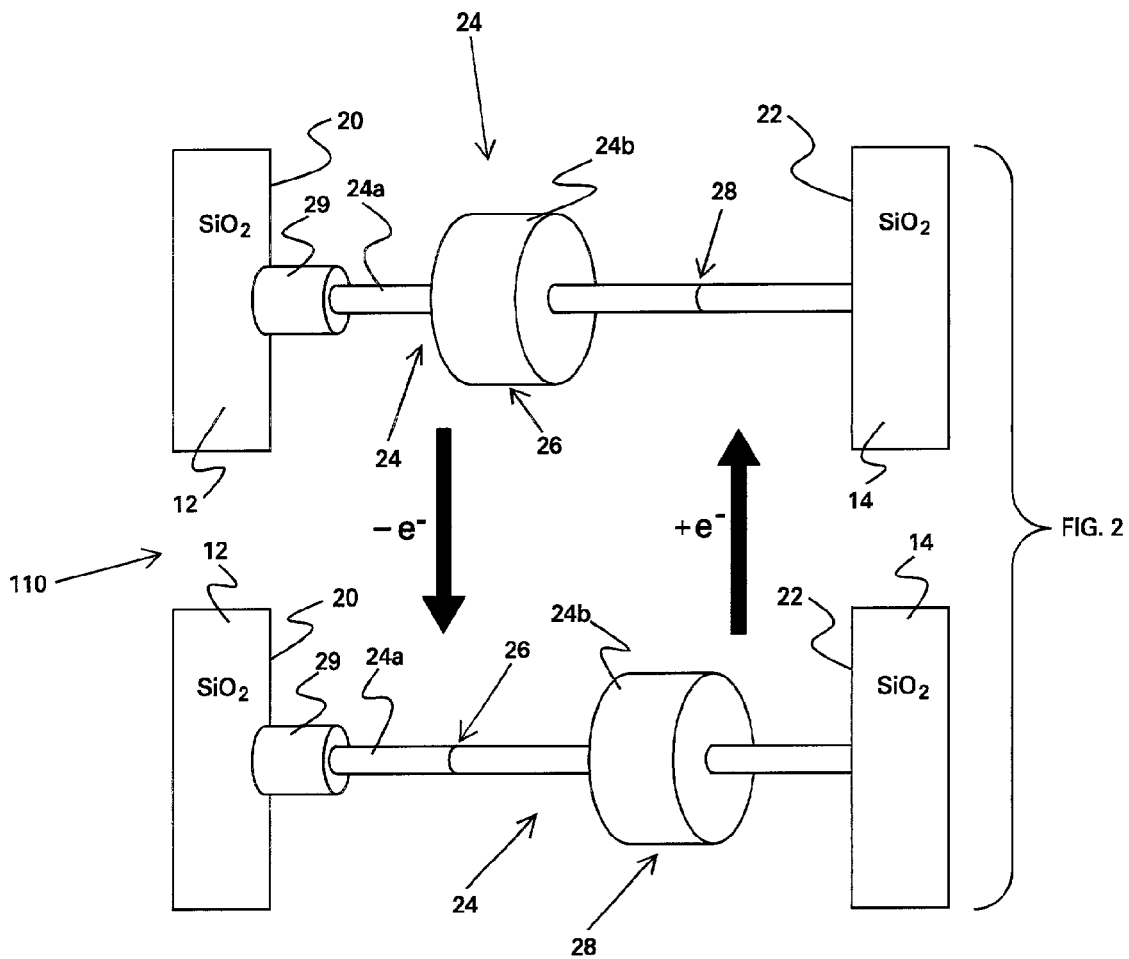
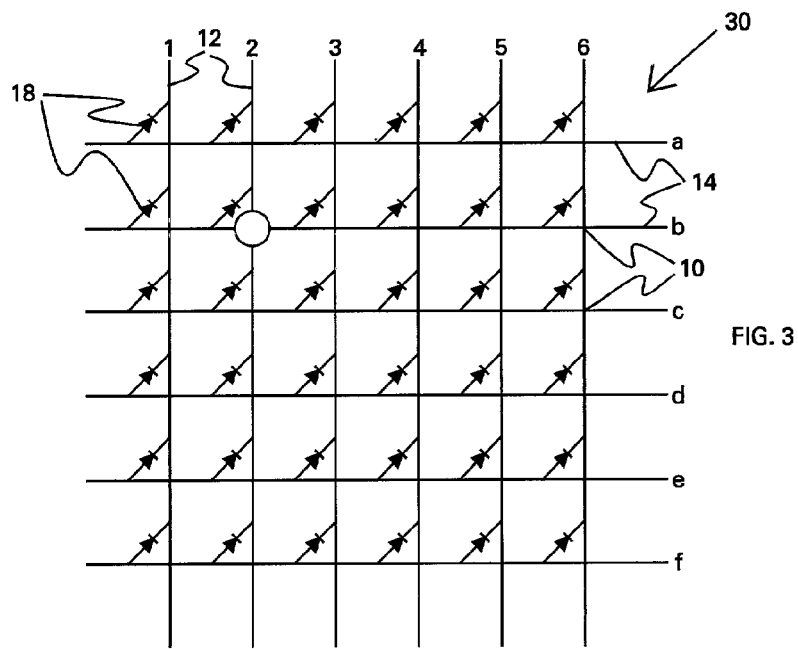

MOLECULAR WIRE CROSSBAR LOGIC (MWCL)

CROSS-REFERENCE TO RELATED APPLICATIONS

The present application is related to the following applications: Ser. No. 09/280,189 ("Molecular Wire Crossbar Memory"; now U.S. Pat. No. 6,128,214, issued Oct. 3, 2000); Ser. No. 09/280,225 ("Molecular-Wire Crossbar Interconnect (MWCI) For Signal Routing And Communications"; now U.S. Pat. No. 6,314,019, issued Nov. 6, 2001); Ser. No. 09/282,049 ("Demultiplexer for a Molecular Wire Crossbar Network (MWCN Demux)"; now U.S. Pat. No. 6,256,767, issued Jul. 3, 2001); Ser. No. 09/280,188 ("Molecular Wire Transistor (MWT)"; abandoned, with a first divisional application Ser. No. 09/699,080 filed on Oct. 26, 2000, now U.S. Pat. No. 7,030,408, issued Apr. 18, 2006, and a second divisional application Ser. No. 09/699,269 filed on Oct. 26, 2000, now U.S. Pat. No. 6,559,468, issued May 6, 2003); and Ser. No. 09/282,048 ("Chemically Synthesized and Assembled Electronic Devices"; now U.S. Pat. No. 6,459,095, issued Oct. 1, 2002, with a divisional application, Ser. No. 09/907,314 filed on Jul. 17, 2001, now U.S. Pat. No. 6,846,682, issued Jan. 25, 2005, which in turn generated a divisional application, Ser. No. 10/699,172 filed on Oct. 31, 2003, now U.S. Pat. No. 6,903,366, issued Jun. 7, 2005), all filed on even date herewith. The present application employs the chemical synthesis and assembly techniques disclosed and claimed in U.S. Pat. Nos. 6,459,095, 6,846,682, and 6,903,366 and the crossbar interconnections disclosed and claimed in U.S. Pat. No. 6,314,019 and is used in the demultiplexer circuits disclosed and claimed in U.S. Pat. No. 6,256,767.

TECHNICAL FIELD

The present invention relates generally to electronic devices whose functional length scales are measured in nanometers, and, more particularly, to a programmable logic array based on crossed nanometer-scale wires joined by bi-stable molecules at the intersecting junctions.

BACKGROUND ART

The silicon (Si) integrated circuit (IC) has dominated electronics and has helped it grow to become one of the world's largest and most critical industries over the past thirty-five years. However, because of a combination of physical and economic reasons, the miniaturization that has accompanied the growth of Si ICs is reaching its limit. The present scale of devices is on the order of tenths of micrometers. New solutions are being proposed to take electronics to ever smaller levels; such current solutions are directed to constructing nanometer scale devices.

Prior proposed solutions to the problem of constructing nanometer scale devices have involved (1) the utilization of extremely fine scale lithography using X-rays, electron, ions, scanning probes, or stamping to define the device components; (2) direct writing of the device components by electrons, ions, or scanning probes; or (3) the direct chemical synthesis and linking of components with covalent bonds. The major problem with (1) is that the wafer on which the devices are built must be aligned to within a fraction of a nanometer in at least two dimensions for several successive stages of lithography, followed by etching or deposition to build the devices. This level of control will be extremely expensive to implement. The major problem with (2) is that it is a serial process, and direct writing a wafer full of complex devices, each containing trillions of components, could well require many years. Finally, the problem with (3) is that the only known chemical analogues of high information content circuits are proteins and DNA, which both have extremely complex and, to date, unpredictable secondary and tertiary structures that causes them to twist into helices, fold into sheets, and form other complex 3D structures that will have a significant and usually deleterious effect on their desired electrical properties as well as make interfacing them to the outside world impossible.

The present inventors have developed new approaches to nanometer-scale devices, comprising crossed nano-scale wires that are joined at their intersecting junctions with bi-stable molecules, as disclosed and in U.S. Pat. Nos. 6,459,095, 6,846,682, and 6,903,366. Wires, such as silicon, carbon and/or metal, are formed in two dimensional arrays. A bi-stable molecule, such as rotaxane, pseudo-rotaxane, or catenane, is formed at each intersection of a pair of wires. The bi-stable molecule is switchable between two states upon application of a voltage along a selected pair of wires.

The present inventors have also developed new approaches to nanometer-scale interconnect arrays as disclosed in U.S. Pat. No. 6,314,019. A molecular-wire crossbar interconnect for signal routing and communications between a first level and a second level in a molecular-wire crossbar is provided. The molecular wire crossbar comprises a two-dimensional array of a plurality of nanometer-scale switches. Each switch is reconfigurable and self-assembling and comprises a pair of crossed wires which form a junction where one wire crosses another and at least one connector species connecting the pair of crossed wires in the junction. The connector species comprises a bi-stable molecule. Each level comprises at least one group of switches and each group of switches comprises at least one switch, with each group in the first level connected to all other groups in the second level in an all-to-all configuration to provide a scalable, defect-tolerant, fat-tree networking scheme. The primary advantage is ease of fabrication, because an active switch is formed any time two wires cross. This saves tremendously on circuit area (a factor of a few times ten), since no other wires or ancillary devices are needed to operate the switch or store the required configuration. This reduction of the area of a configuration bit and its switch to just the area of two crossing wires is a major advantage in constructing a defect-tolerant interconnect network.

Having developed a nanometer-scale crossbar interconnect, effective utilization requires development of logic circuits in order to construct a computer.

A prior solution presented by J. R. Heath et al, "A Defect-Tolerant Computer Architecture: Opportunities for Nanotechnology," *Science*, Vol. 280, pp. 1716-1721 (12 Jun. 1998)], suggests the use of look-up tables (LUTs). These generally take up more area than programmable logic arrays (PLAs).

Thus, a need remains for high density logic circuits, employing nanometer-scale architecture.

DISCLOSURE OF INVENTION

In accordance with the present invention, a programmable logic array (PLA) comprises a two-dimensional array of a plurality of nanometer-scale crossed-wired devices. Each crossed-wire device comprises a junction formed by a pair of crossed wires and at least one connector species connecting the pair of wires and comprising a bi-stable molecule. The junction has a functional dimension in nanometers. A plurality of connector species is configurable as an AND gate and a plurality of connector species is configurable as an OR gate. The configuration chosen determines the number of AND gates and their connection to the OR gates. The exact number of OR gates formed and the exact number of AND gates formed (either of which could be zero) is determined by the configuration of the bi-stable molecules.

By using a process that is completely compatible with building a large interconnect, the present invention solves the problem of constructing an arbitrarily large and complex logic circuit utilizing nanometer-scale components. The interconnect and digital logic manufacturing processes are essentially the same, which avoids the problem of the alignment and electrical connection of two distinct processes. This extends to the nanometer-sized world the primary virtue of contemporary integrated circuits, that their electronic devices and wires are built with the same lithographic process. To be of real value, it is important that the nano-architecture can scale to a very large number of devices. The present invention solves that problem as well.

The very desirable property of this invention is that a single molecular wire crossbar, having diodes or asymmetric non-linear resistors pointing in one specific direction, e.g., always from the horizontal to the vertical wires, is of a form which allows an AND PLA followed by an OR PLA. This permits doing any logic which can be represented as a sum of products in a single logic array. An additional virtue of the AND array followed by the OR array is that the input and output terms go in the same direction. If the vertical wires are the input, then the output will be also on the vertical wires. Thus only one set of wires in the array needs to be extended to the microscopic world of lithographically-formed contacts. This greatly simplifies the design of systems.

Alternatively, with suitable configuration of the molecular wire crossbar, an OR PLA can be followed by an AND PLA. This permits doing any logic which can be represented as a product of sums in a single logic array.

A major advantage of the present invention is that the logic array is self-assembling. It is an extremely regular structure, which can be assembled using chemical reactions. This is in contrast to lookup tables (LUTs). Although the memory of a LUT is very regular, it requires a decode/demultiplex structure for each instance of the LUT. A demultiplexer is rather irregular and difficult to make chemically, and a very large number of the demultiplexers are needed, about one demultiplexer for every ten logic gates. In contrast to the use of only LUTs, the molecular wire crossbar logic can be assembled chemically.

BRIEF DESCRIPTION OF THE DRAWINGS

FIG. 2 is a schematic representation of two crossed nanowires, joined by a rotaxane, and depicting the two bi-stable states;

FIG. 3 is a schematic diagram depicting a diode crossbar architecture, which is employed in the practice of the present invention;

BEST MODES FOR CARRYING OUT THE INVENTION

Definitions

Figure 1A:
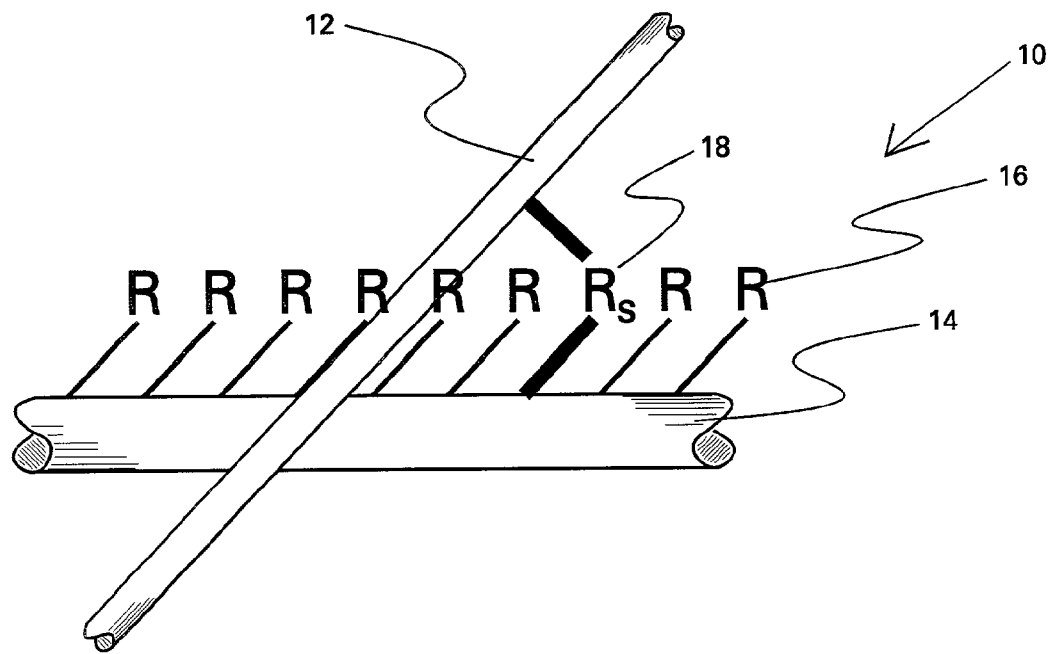
FIG. 1A is a schematic representation of two crossed nanoscale wires, with at least one molecule bridging the gap in accordance with the invention.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read only memory (PROM), for example.

The term "reconfigurable" means that a switch can change its state multiple times via a reversible process such as an oxidation or reduction; in other words, the switch can be opened and closed multiple times such as the memory bits in a random access memory (RAM).

The term "bi-stable" as applied to a molecule means a molecule having two relatively low energy states. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.04 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 1 to 10 micrometers, heights that can range from a few tens of nanometers to a micrometer, and lengths of several micrometers and longer.

A crossbar is an array of switches that connect each wire in one set of parallel wires to every member of a second set of parallel wires that intersects the first set (usually the two sets of wires are perpendicular to each other, but this is not a necessary condition).

Crossed Wire Switch

In related U.S. Pat. Nos. 6,459,095, 6,846,682, and 6,903,366, a basic scheme for chemically synthesized and assembled electronic devices is provided. That application discloses and claims a quantum state switch, which comprises an adjustable tunnel junction between two nanometer-scale wires. In accordance with that invention, an electronic device is provided, comprising two crossed wires having nanometer dimensions, provided with functionalizing groups that control conductivity type of the wires. A plurality of such crossed wires may be assembled to provide a variety of different devices and circuits.

That invention enables the construction of electronic devices on a nanometer scale using relatively stiff wires that are chemically functionalized to provide the desired electronic properties and which are then chemically-assembled to create active electronic devices simply by forming contact with other wires.

Figure 1B:
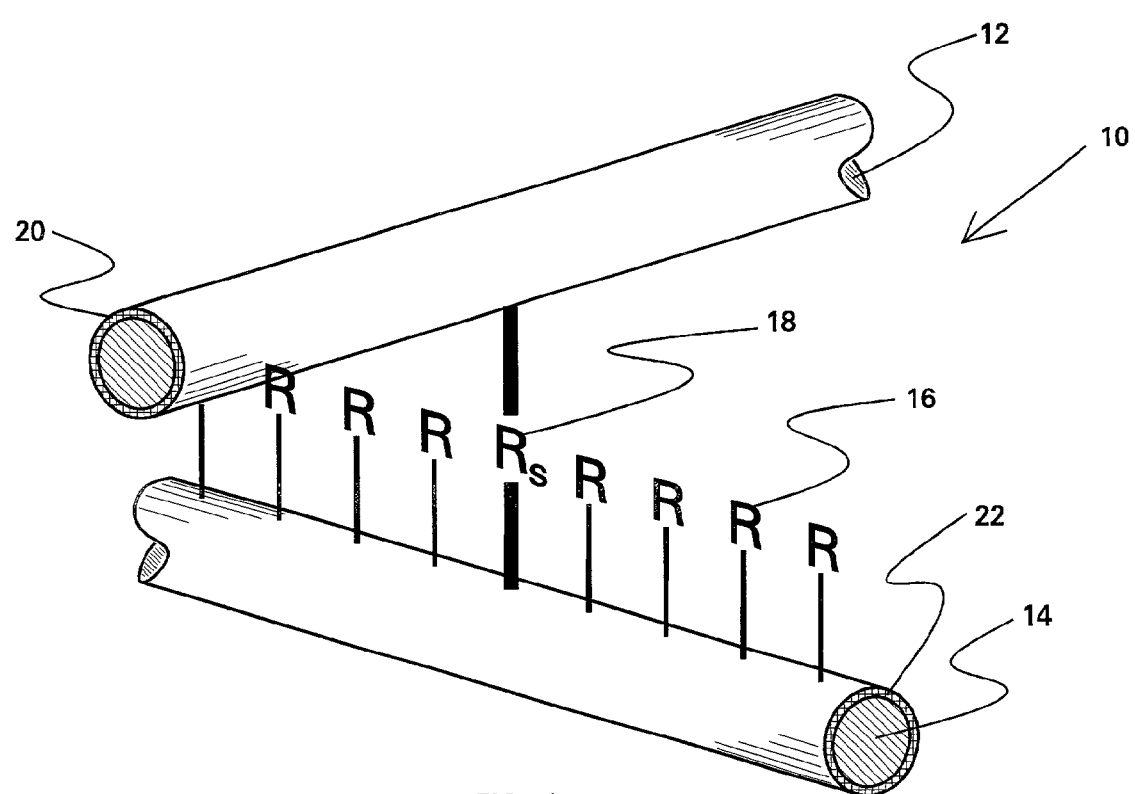
FIG. 1B is a perspective view, depicting the device shown in FIG. 1A.

The essential device features are shown in FIGS. 1A-1B. A crossed wire switch 10 comprises two wires 12, 14, each either a metal or semiconductor wire, that are crossed at some non-zero angle. In between those wires is a layer of molecules or molecular compounds 16, denoted R in FIGS. 1A and 1B. The particular molecules 18 (denoted $R_s$) that are sandwiched at the intersection, or junction, of the two wires 12, 14 are identified as switch molecules. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

Further, FIG. 1B depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$ 18 is formed.

That invention allows electronic devices to be formed with a size on the order of tens of nanometers to a few nanometers simply by making contact between two wires. By choosing the molecules which form a doping layer on the wires (modulation doping), it is possible to build devices with a wide variety of specifically desired electrical properties. The possibility of reversibly or even irreversibly changing the properties of the device via an electrochemical reaction with a large hysteresis loop in its I-V characteristic enables devices to be altered after they are built and may provide new and useful functions.

The electronic device 10 of that invention, in its simplest state, is a quantum state switch comprising an adjustable tunnel junction 18 between two nanometer-scale wires 12, 14. A plurality of sets of wires, one set configured at an angle to the other, provides a two-dimensional array of switches. The wires are provided with a molecular species 16 at the junctions 18 that, in one embodiment, is bi-stable. The molecule species is addressed by setting voltages on the appropriate two wires. Thus, by the simple process of crossing one type of coated wire over the other, a switch is formed at wherever the intersection occurs; the exact position of the connecting point is not important for this architecture. Furthermore, the chemical species that form the molecular link between the wires can be electrochemically oxidized or reduced. Some types of molecules can be cycled reversibly and others will react irreversibly. The chemical state of the molecular switches determines the tunneling resistance between the two wires, which is exponentially dependent on both the width and the barrier height of the tunneling gap.

An example of a bi-stable molecular switch 110 is shown in FIG. 2, comprising a rotaxane 24. The rotaxane 24 contains two molecular components—a backbone 24a that contains one or more binding sites, and a circular molecule (the 'ring') 24b that fits around the backbone like a ring on a post. The ring 24b is in intimate mechanical contact, but is not chemically bonded to the backbone 24a. Depending on how the ring is fabricated, the ring may have one or more preferred minimum-energy locations along the backbone. In FIG. 2, these sites are denoted 26 (left site) and 28 (right site).

The moiety 29 on the left side of the rotaxane 24 shows that the molecule is asymmetric and therefore can have different properties when oxidized than when reduced.

Crossbar Logic Array

The present invention is a programmable logic array (PLA) that can be constructed on a nanometer scale using the molecular wire crossbar 30 of FIG. 3. Programmable logic arrays have been used since the early 1970s; see, e.g., Carver Mead and Lynn Conway, *Introduction to VLSI Systems*, Addison-Wesley, 1980, chapter 3, section 10, pp. 79-82; U.S. Pat. No. 3,975,623, "Logic Array with Multiple Readout Tables", issued Aug. 17, 1976; and U.S. Pat. No. 4,208,728, "Programmable Logic Array", issued Jun. 17, 1980. For most logic designs, PLAs are more efficient than using a look-up table (LUT). All of these previous realizations of PLAs use lithography to form the components.

It is always true of an AND array followed by an OR array that the input and output terms go in the same direction. If the vertical wires 12 are the input, then the output will be also on the vertical wires. Thus only one set of wires in the array needs to be extended to the microscopic world of lithographically-formed contacts. This greatly simplifies the design of systems.

The same is also true for OR arrays followed by AND arrays. The present invention can be used to form either configuration. While the discussion below is primarily directed to AND arrays followed by OR arrays, it will be understood by those skilled in the art that logic circuits comprising OR arrays followed by AND arrays may also be formed, with suitable adjustment in resistor values.

The present invention uses either diodes or asymmetric non-linear resistors at the junctions 18 of the crossed wires 12, 14 to perform logic. By asymmetric non-linear resistors is meant resistors that have both a non-linear I-V curve and an asymmetric I-V curve with respect to the sign of the voltage.

Diode Array

In order to create the PLA at a nanometer scale, the individual connection species at the cross points either acts as a diode with relatively low resistance when it is forward biased, or it acts as a very high resistance connection between the horizontal and vertical wires, depending on whether the configuration bit is set to a "1" or a "0". This can be done with a single type of molecule. A single molecule serves both as a configuration bit and an electrical device (e.g. resistor, resonant tunneling resistor, or diode). This diode array in conjunction with external resistors, which are in series with the nanowires that form the array, enables performing AND logic as well as OR logic. The very desirable property of this invention is that a single array, having diodes pointing in one specific direction, e.g., always from the horizontal wires to the vertical wires, is of a form which allows an AND PLA followed by an OR PLA. This permits performing any logic that can be represented as a sum of products in a single logic array. If both TRUE and COMPLEMENT terms are provided for all variables from the outside world, and they are computed internally as needed, then one can use the molecular wire logic array to do arbitrary logic.

If, in fact, all of the inputs and outputs are connected instead to the horizontal wires, then an OR PLA followed by an AND PLA is also formed, which is also a useful logic circuit within the scope of the present invention. This permits performing any logic that can be represented as a product of sums in a single logic array.

Figure 4A:
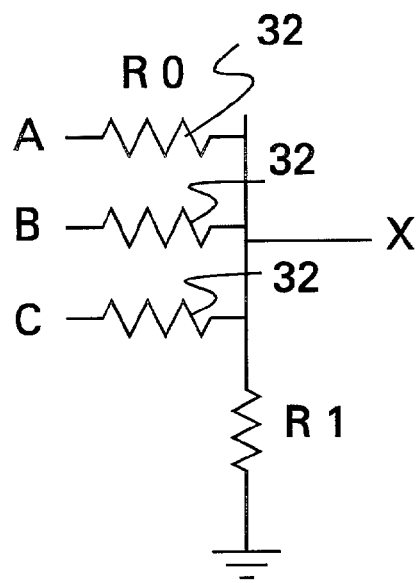
FIG. 4A is a schematic diagram of a simple resistive circuit having a multi-input OR function.
Figure 4B:
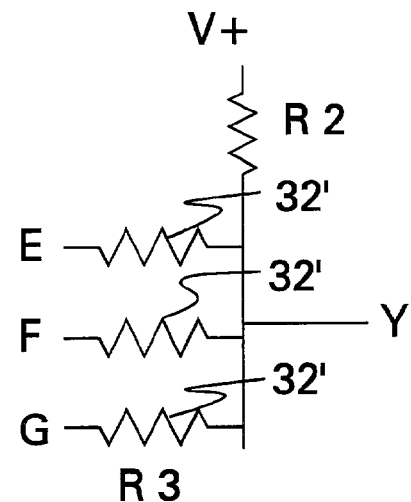
FIG. 4B is a schematic diagram of a simple resistive circuit having a multi-input AND function.

Consider, for example, the simple resistive circuits shown in FIGS. 4A and 4B. If the appropriate resistors 32 are used for R0 (32' for R3), then the circuit shown in FIG. 4B has a multi-input AND function at point Y, while the circuit shown in FIG. 4A has a multi-input OR function at point X. However, AND and OR functions cannot be combined because the resulting circuit is linear.

Figure 5A:
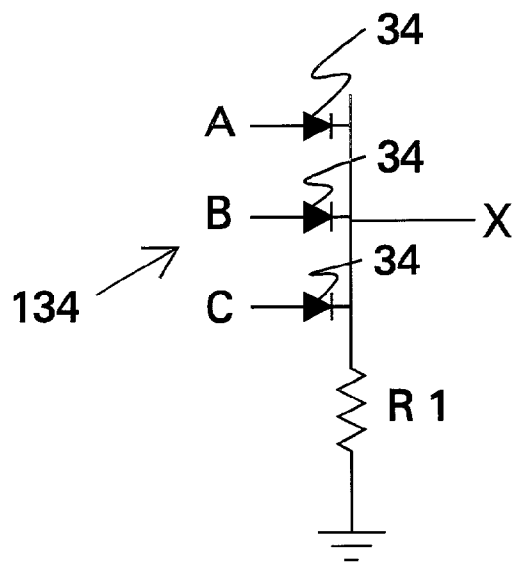
FIG. 5A is a schematic diagram of a simple diode circuit having a multi-input OR function.
Figure 5B:
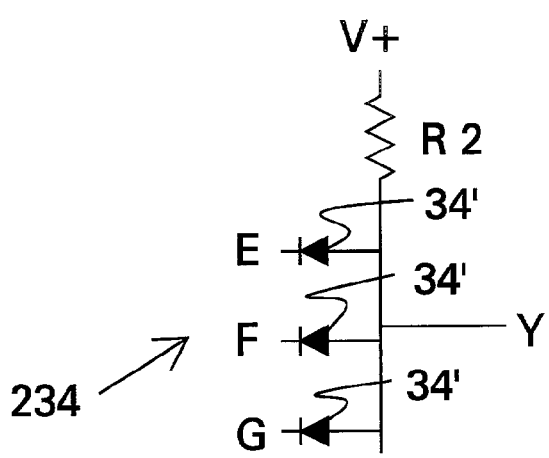
FIG. 5B is a schematic diagram of a simple diode circuit having a multi-input AND function.

The non-linear function of a diode used in FIGS. 5A and 5B permits construction of OR gates 134 and AND gates 234, respectively, which can be combined to compute arbitrary Boolean functions (see FIG. 6A) if the complements of all the input variables are available for use. Note that the diodes 34, 34', 36 in FIG. 6A always point towards wire 38 and away from wires 40, 40'. This symmetry permits construction of a molecular wire array that can be used to evaluate arbitrary Boolean functions, here, as a sum of products: X=(ABC)+(EFG). For this combination of AND gates 234 and OR gates 134 to function correctly, the values of the pull-up resistors R1 and the pull-down resistor R2 must be chosen to satisfy the following constraints:

$$R1 + D_f < R2 \quad\quad 1.$$

$$R2 < R1 + D_r \quad\quad 2.$$

$$R1 < (D_f + R2)/F \quad\quad 3.$$

$$D_f < R1. \quad\quad 4.$$

Constraint 1 allows the OR gate to have a "1", high, voltage level which is always above its "0", low, voltage level for all combinations of "0" and "1" inputs to the AND and OR gates. $D_f$ is the effective resistance of a forward biased diode.

Constraint 2 allows the OR gate to have "0", low, voltage level which is always below its "1", high, voltage level for all combinations of "0" and "1" inputs to the AND and OR gates. $D_r$ is the effective resistance of a reverse biased diode.

Constraint 3 allows the AND gate to have "1", high, voltage level which is always above its "0", low, voltage level for all combinations of "0" and "1" inputs to the AND and OR gates. F is the fanout of the AND gate.

Constraint 4 allows the AND gate to have "0", low, voltage level which is always below its "1", high, voltage level for all combinations of "0" and "1" inputs to the AND and OR gates.

Asymmetric Non-Linear Resistor Array

Alternatively to the diode implementation of the invention, the individual connection species at the cross points either acts as an asymmetric non-linear resistor with relatively low resistance when it is forward biased and much higher resistance when it is reverse biased, or it acts as a very high resistance connection between the horizontal and vertical wires, depending on whether the configuration bit is set to a "1" or a "0". This can be done with a single type of molecule. A single molecule serves both as a configuration bit and an electrical device (e.g., resistor and resonant tunneling resistor). This asymmetric non-linear resistor array in conjunction with external resistors, which are in series with the nanowires that form the array, permits performing AND logic as well as OR logic. The very desirable property of the present invention is that a single array, having asymmetric non-linear resistors pointing in one specific direction, e.g., always from the vertical to the horizontal wires, is of a form which allows an AND PLA followed by an OR PLA. This permits performing any logic that can be represented as a sum of products in a single logic array. If both TRUE and COMPLEMENT terms are provided for all variables from the outside world, and they are computed internally as needed, then one can use the molecular wire logic array to do arbitrary logic.

Figure 6A:
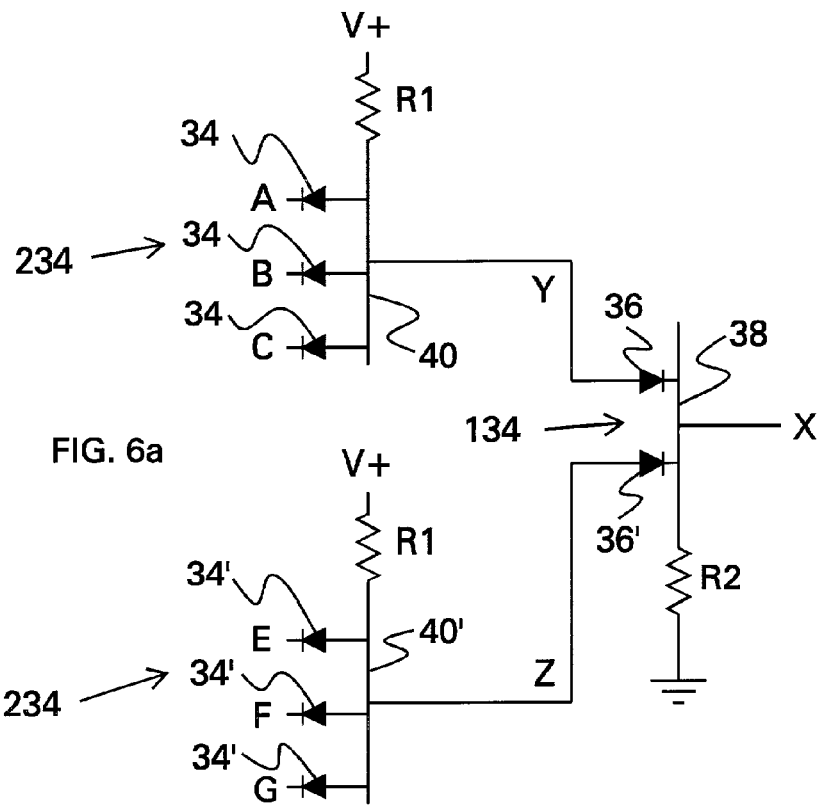
FIG. 6A is a schematic diagram of a diode logic circuit that permits evaluation of any Boolean expression as a sum of products.
Figure 6B:
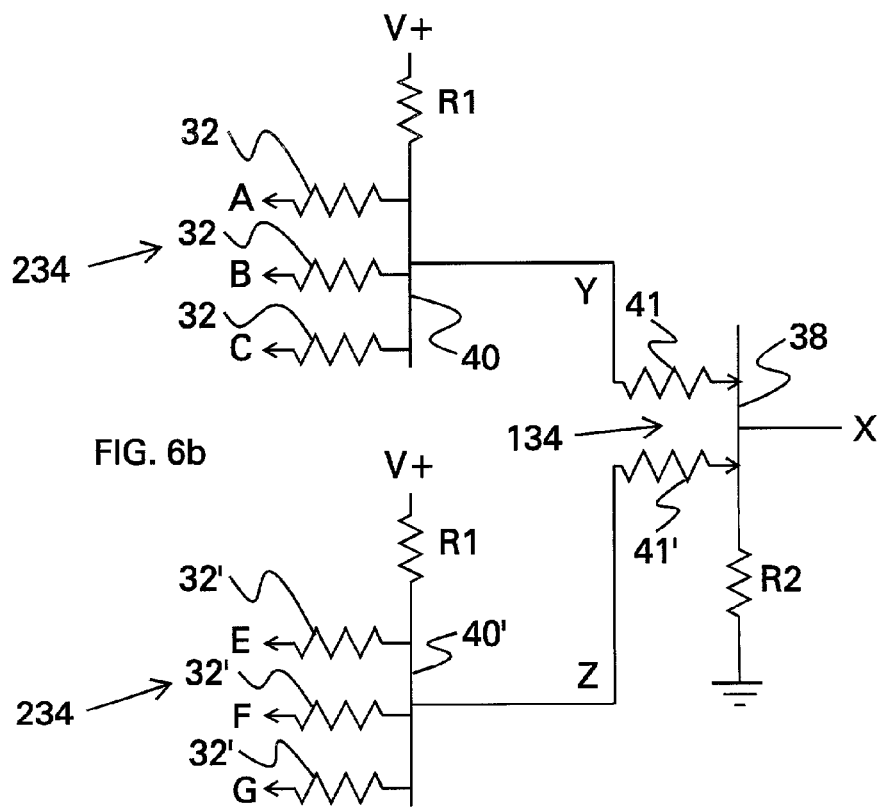
FIG. 6B is a schematic diagram of an asymmetric non-linear resistor logic circuit that permits evaluation of any Boolean expression as a sum of products.

FIG. 6B shows the same circuit of FIG. 6A, but implemented with an asymmetric non-linear resistor array. Again, the non-linear function of an asymmetric non-linear resistor array permits construction of AND gates 234 and OR gates 134 which can be combined to compute arbitrary Boolean functions if the complements of all the input variables are available for use. Note that the asymmetry of the resistors 32, 32', 41 in FIG. 6B always point towards wire 38 and away from wires 40, 40'. This permits construction of a molecular wire array that can be used to evaluate arbitrary Boolean functions, here, as a sum of products: X=(ABC)+(EFG). For this combination of AND and OR gates to function correctly, the values of the pull-up resistors R1 and the pull-down resistor R2 must be chosen to satisfy the following constraints:

$$R1 + R_1 < R2 \quad\quad 1.$$

$$R2 < R1 + R_r \quad\quad 2.$$

$$R1 < (R_f + R2)/F \quad\quad 3.$$

$$R_f < R1. \quad\quad 4.$$

Constraint 1 allows the OR gate to have a "1", high, voltage level which is always above its "0", low, voltage level for all combinations of "0" and "1" inputs to the AND and OR gates. $R_1$ is the effective resistance of an asymmetric non-linear resistor with a low bias voltage in the forward direction.

Constraint 2 allows the OR gate to have "0", low, voltage level which is always below its "1", high, voltage level for all combinations of "0" and "1" inputs to the AND and OR gates. $R_r$ is the effective resistance of a reverse biased asymmetric non-linear resistor.

Constraint 3 allows the AND gate to have "1", high, voltage level which is always above its "0", low, voltage level for all combinations of "0" and "1" inputs to the AND and OR gates. F is the fanout of the AND gate. $R_f$ is the effective resistance of an asymmetric non-linear resistor with a high bias voltage in the forward direction.

Constraint 4 allows the AND gate to have "0", low, voltage level which is always below its "1", high, voltage level for all combinations of "0" and "1" inputs to the AND and OR gates.

Example Circuit 1

Figure 7:
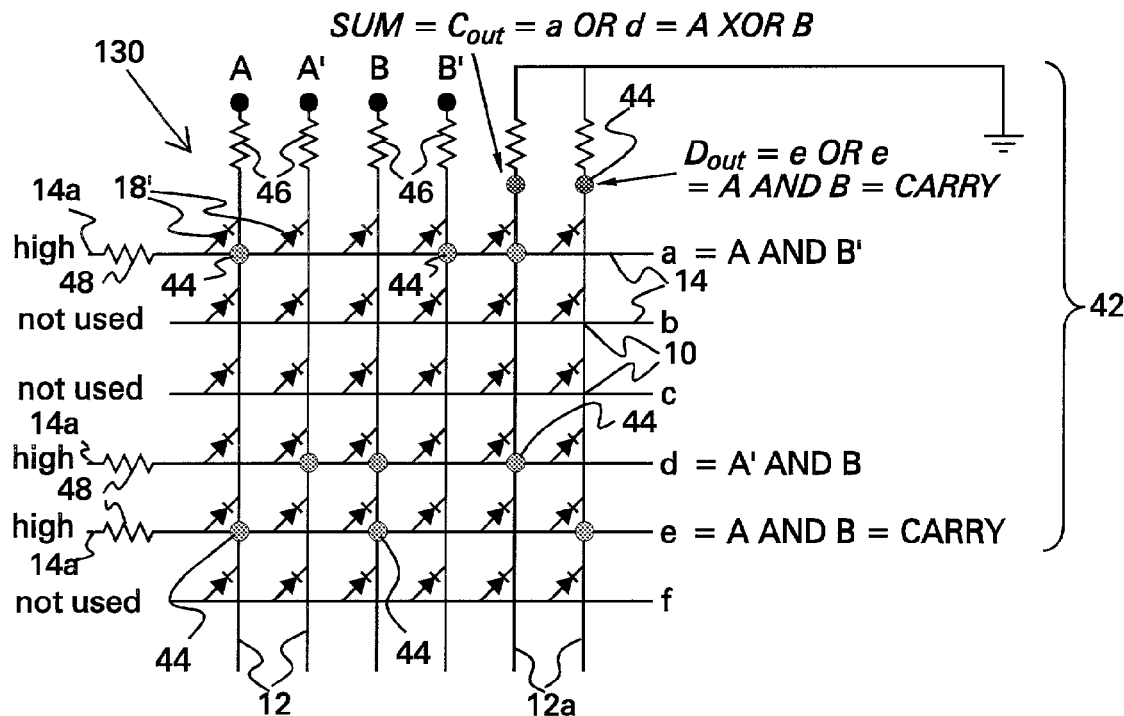
FIG. 7 is a schematic diagram of a molecular wire crossbar as a defect-tolerant programmable logic array, employing diodes as the logic elements.
Figure 8:
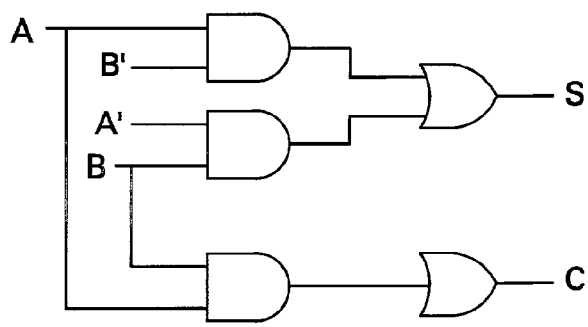
FIG. 8 is a schematic diagram depicting the equivalent circuit shown in FIG. 7.

With only the diode-logic elements described above, a 6×6 diode-crossbar 30, for example, can be turned into a defect-tolerant 2-bit adder 42, as shown in FIG. 7, which uses the logic elements illustrated in FIG. 6A. This logic circuit 42 operates as follows. Certain of the junctions are set to "1", and these junctions are denoted 44 in FIG. 7. This can be carried out similar to how the crossbar diode memory is configured. These are diode junctions. All other junctions are assumed to have very high resistance and not short the vertical and horizontal wires 12 and 14. Resistors 46 are then connected at the top of the crossbar 30, which may be a relatively long section of nanowire. Additional resistors 48 are connected to the side of the crossbar 30, as needed. This adder uses 4 inputs, labeled A, A', B, and B'. A and B are the two 1-bit numbers that are to be added together, and A' and B' are the complements of those numbers (i.e. if A="1", then A'="0"). Using complements avoids the necessity of using an inverter inside the crossbar 30 (see the equivalent circuit in FIG. 8, where "S" is SUM and "C" is CARRY). By holding the appropriate three horizontal wires 14a high (noted on the left-hand side of the crossbar), a series of AND gates is generated, with their outputs given at the right. The two vertical wires 12a at the right of the crossbar are configured as OR gates. Note that the carry is connected to the sixth column by setting the appropriate switch, so all inputs and all outputs are on the same side (the top) of the crossbar 30.

Example Circuit 2

Figure 9:
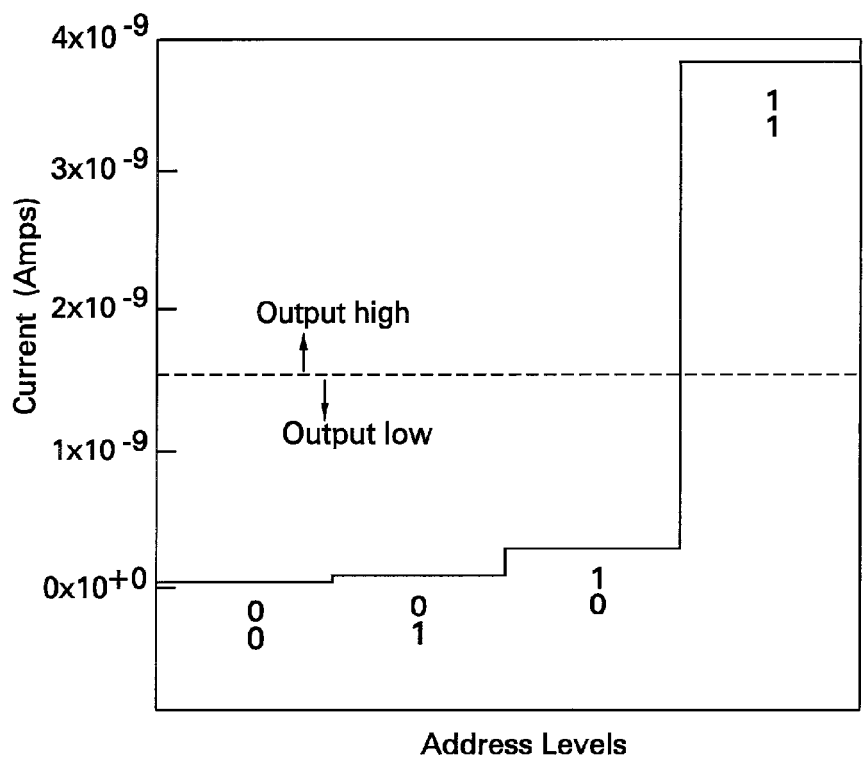
FIG. 9, on coordinates of current (amps) and address levels, is a plot of three asymmetric non-linear resistor devices configured together within a single crossbar to form an AND gate and replacing the resistor R2 in the AND gate shown in FIG. 4B with a fourth (oxidized) device.

FIG. 9 depicts the experimentally-determined truth table for an AND gate in which three switches (within a single crossbar) have been configured together to make an AND gate; this device is essentially the same as that shown in FIG. 4B, except that instead of supplying an external resistor, an additional molecular switch was used. It will be noted that in a conventional linear resistor network, even if one had complete control over each resistance value, the best one could hope for in terms of a high/low ratio is a factor of 2, yet the network disclosed herein achieves greater than a factor of 10. This is because the resistors employed in the network of the present invention are based on resonant tunneling through molecules, and the resistance values are voltage-dependent. They are an example of asymmetric non-linear resistors. This allows a much greater voltage difference between logic "0" and logic "1" than can be achieved with linear resistors.

Figure 10:
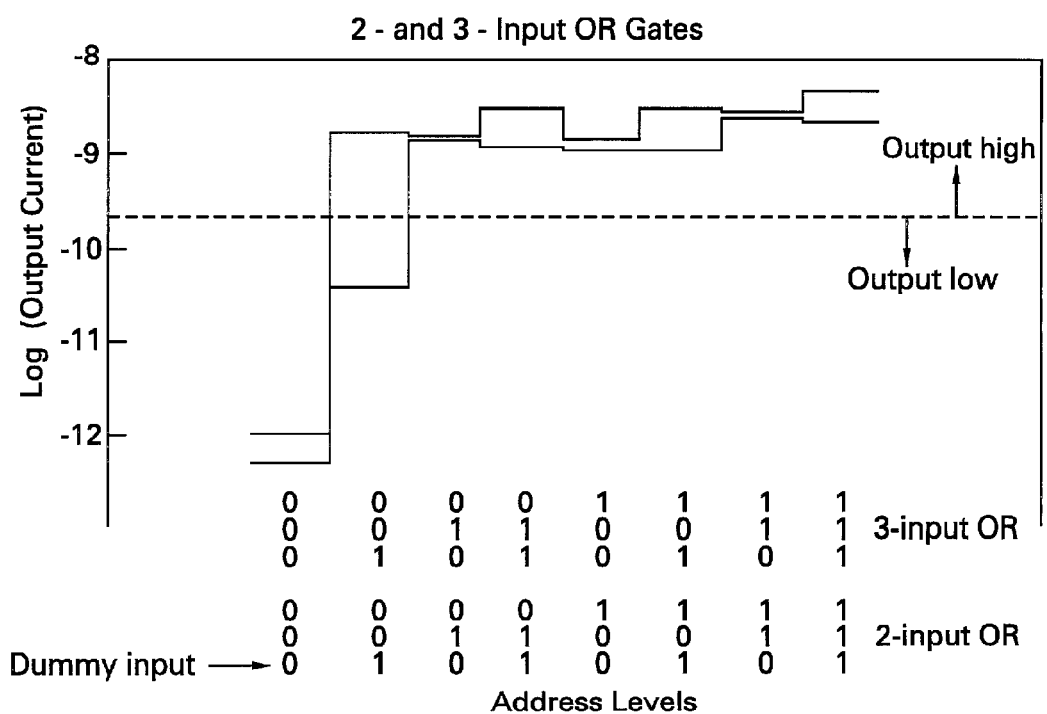
FIG. 10, on coordinates of current (amps) and address levels, presents an experimentally-derived truth table for a 3-input OR gate, much like the one depicted in FIG. 5A, that was subsequently reconfigured into a 2-input OR gate by opening one of the switches.

FIG. 10 depicts the experimentally derived truth table for a 3-input OR gate, that was subsequently reconfigured into a 2-input OR gate by opening one of the switches; this is essentially the same device as depicted in FIG. 5A. It will be noted that the Y-axis is a log-axis, so that the ratio between high/low is actually greater than in the case of the AND gate. This is a demonstration of configurable logic—something that is important for any molecular-based defect tolerant architecture. This demonstration used asymmetric non-linear resonant tunneling resistors.

Other Considerations

The essence of the present invention is that the physical logic array is first constructed and then programmed with logical design. The physical construction is extremely regular, since the assembly of wires into crossbars is thermodynamically driven or is constructed using extremely simple lithographic processes that do not require a high precision for aligning the different levels of the system. Once the system has self-assembled, or has been assembled, a very complex logic design is down-loaded electronically by setting the appropriate configuration bits.

The connecting species 10 between the two sets of wires 12, 14 are self-aligning. The crossbar wires are coated with distinct molecules 20, 22, such that only at the intersection 18 of two wires 12, 14 are the two types of molecules close enough to bridge the gap between the two wires and form a connecting species 10. The switches can then be electrically set by inducing a chemical reaction between the molecules. A unique connecting species can be set exclusive of all other connecting species by applying two different voltages to the two wires that define the connecting species (the bit and word lines) while holding all other wires at an intermediate voltage. The connecting species are set by a chemical redox reaction which either happens or does not happen based on applying a fairly large (e.g., 0.5 to 1.0 V) potential that exceeds a well-defined threshold between the two crossing wires. Thus, there is no "half select" problem where a single wire can accidentally set or reset a connecting species. The physical advantages of the invention are in its scalability, low power consumption, the fact that the configuration bits have well-defined threshold voltages, low sensitivity to fields and temperature, and the read process is non-destructive. It is expected that as this architecture matures, it will eventually utilize carbon nanotubes, which have a diameter of about 1 nm and will certainly define the wiring limit for electronic devices. The molecular wire logic array is basically a voltage-controlled device, and therefore the fact that it contains components with relatively large resistance is actually an advantage in terms of power consumption.

Also, the redox reactions, that will be utilized to set and reset configuration bits at the crosspoints, are voltage initiated, with values typically between 0.5 and 1 V. These threshold voltages are so reproducible that the technique of cyclic voltammetry, i.e., measuring the "waves" or steps in the I-V curve for such a redox reaction, has been used by chemists for decades as an analytical technique to determine what types of functional groups are present on an "unknown" molecule.

Also, the size of the voltage required to change the state of the configuration bit means the bit should be stable up to temperatures that would destroy the entire device, so the configuration bits themselves will not be the most sensitive component of a system.

Thus, there has been disclosed a molecular wire crossbar logic comprising crossed nanometer-scale wires joined by bi-stable molecules at the intersecting junctions. It will be apparent to those skilled in this art that various changes and modifications of an obvious nature may be made, and all such changes and modifications are considered to fall within the scope of the appended claims.

What is claimed is:

1. A programmable logic array comprising a two-dimensional array of a plurality of crossed-wire devices, each device comprising a junction formed by a pair of crossed wires where one wire crosses another and at least one connector species connecting said pair of crossed wires in said junction, said junction having a functional dimension in nanometers and said at least one connector species comprising a bi-stable molecule, wherein a plurality of connector species is configurable as an AND gate and a plurality of connector species is configurable as an OR gate.

2. The programmable logic array of claim 1 wherein said junction forms an asymmetric non-linear resistor.

3. The programmable logic array of claim 1 wherein said junction forms a diode.

4. The programmable logic array of claim 1 wherein said junction has a state that is altered by application of a voltage.

5. The programmable logic array of claim 1 wherein said junction is a singly configurable or reconfigurable one connector species.

6. The programmable logic array of claim 1 wherein at least one of said two wires has a thickness that is about the same size as said at least one connector species, and over an order of magnitude longer than its diameter.

7. The programmable logic array of claim 6 wherein both of said two wires have a thickness that is about the same size as said at least one connector species.

8. The programmable logic array of claim 1 wherein both of said two wires have a thickness that ranges from sub-micrometer to micrometer.

9. The programmable logic programmable logic array of claim 1 comprising a plurality of AND gates and a plurality of OR gates.

10. The programmable logic array of claim 9 wherein said plurality of AND gates is followed by said plurality of OR gates.

11. The programmable logic array of claim 9 wherein said plurality of OR gates is followed by said plurality of AND gates.

12. The programmable logic array of claim 1 wherein each said wire independently comprises a conductor or a semiconductor.

13. The programmable logic array of claim 12 further including an insulating layer or a modulation-doped coating on at least one of said wires.

14. The programmable logic array of claim 13 wherein said insulating layer comprises an oxide.

15. The programmable logic array of claim 12 wherein said semiconductor is internally doped.

16. A method of fabricating a programmable logic array comprising a two-dimensional array of a plurality of crossed-wire devices, each device comprising a junction formed by a pair of crossed wires where one wire crosses another and at least one connector species connecting said pair of crossed wires in said junction, said junction having a functional dimension in nanometers and said at least one connector species comprising a bi-stable molecule, wherein a plurality of connector species is configurable as an AND gate and a plurality of connector species is configurable as an OR gate, said method comprising (a) forming a first set of wires comprising a plurality of said first wires, (b) depositing said connector species over at least a portion of said first set of wires, (c) forming a second set of wires comprising a plurality of said second wires over said first set of wires so as to form said junction at each place where a second said wire crosses a first said wire, (d) configuring a first plurality of said connector species as an AND gate, and (e) configuring a second plurality of said connector species as an OR gate.

17. The method of claim 16 wherein said junction forms an asymmetric non-linear resistor.

18. The method of claim 16 wherein said junction forms a diode.

19. The method of claim 16 wherein said junction has a state that is altered by application of a voltage.

20. The method of claim 16 wherein said junction is a singly configurable or reconfigurable one connector species.

21. The method of claim 16 wherein at least one of said two wires has a thickness that is about the same size as said at least one connector species, and over an order of magnitude longer than its diameter.

22. The method of claim 21 wherein both of said two wires have a thickness that is about the same size as said at least one connector species.

23. The method of claim 16 wherein both of said two wires have a thickness that ranges from sub-micrometer to micrometer.

24. The method of claim 16 comprising a plurality of AND gates and a plurality of OR gates.

25. The method of claim 24 wherein said plurality of AND gates is followed by said plurality of OR gates.

26. The method of claim 24 wherein said plurality of OR gates is followed by said plurality of AND gates.

27. The method of claim 16 wherein each said wire independently comprises a conductor or a semiconductor.

28. The method of claim 27 further including forming an insulating layer or a modulation-doped coating on at least one of said wires.

29. The method of claim 28 wherein said insulating layer comprises an oxide.

30. The method of claim 27 wherein said semiconductor is internally doped.

* * * * *